(12) United States Patent
Assefa et al.

(10) Patent No.: US 7,755,921 B2
(45) Date of Patent: Jul. 13, 2010

(54) METHOD AND APPARATUS FOR FABRICATING SUB-LITHOGRAPHY DATA TRACKS FOR USE IN MAGNETIC SHIFT REGISTER MEMORY DEVICES

(75) Inventors: Solomon Assefa, Elmsford, NY (US); Michael C. Gaidis, Wappingers Falls, NY (US); Eric A. Joseph, White Plains, NY (US); Stuart Stephen Papworth Parkin, San Jose, CA (US); Christy S. Tyberg, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 185 days.

(21) Appl. No.: 11/838,663

(22) Filed: Aug. 14, 2007

(65) Prior Publication Data

US 2009/0046493 A1 Feb. 19, 2009

(51) Int. Cl.
*G11C 19/00* (2006.01)
(52) U.S. Cl. .......................................... 365/80; 365/87
(58) Field of Classification Search .................. 365/80, 365/87, 86; 438/3; 427/129
See application file for complete search history.

(56) References Cited

U.S. PATENT DOCUMENTS

| 2004/0251232 A1* | 12/2004 | Chen et al. ........... 216/22 |
| 2004/0252539 A1 | 12/2004 | Parkin |
| 2007/0087454 A1 | 4/2007 | Chen et al. |

OTHER PUBLICATIONS

International Search Report and Written Opinion for PCT/US08/73066, Oct. 22, 2008, consists of 9 unnumbered pages.

* cited by examiner

*Primary Examiner*—Vu A Le

(57) ABSTRACT

In one embodiment, the invention is a method and apparatus for fabricating sub-lithography data tracks for use in magnetic shift register memory devices. One embodiment of a memory device includes a first stack of dielectric material formed of a first dielectric material, a second stack of dielectric material surrounding the first stack of dielectric material and formed of at least a second dielectric material, and at least one data track for storing information, positioned between the first stack of dielectric material and the second stack of dielectric material, the data track having a high aspect ratio and a substantially rectangular cross section.

35 Claims, 15 Drawing Sheets

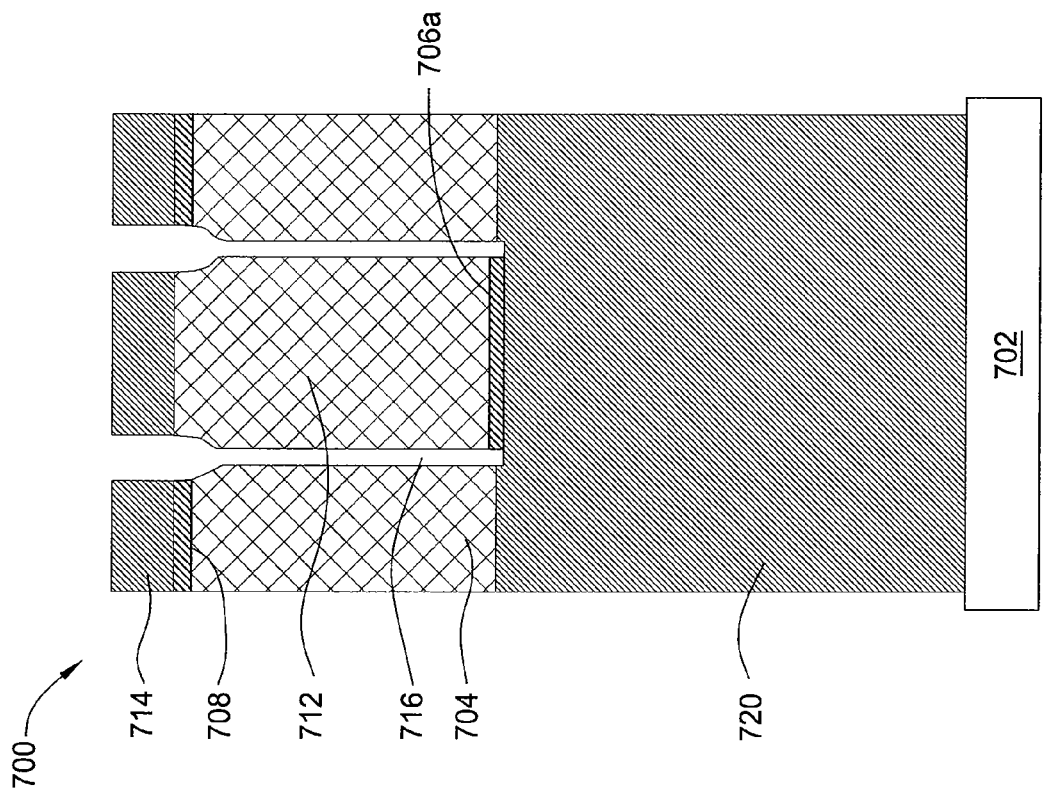
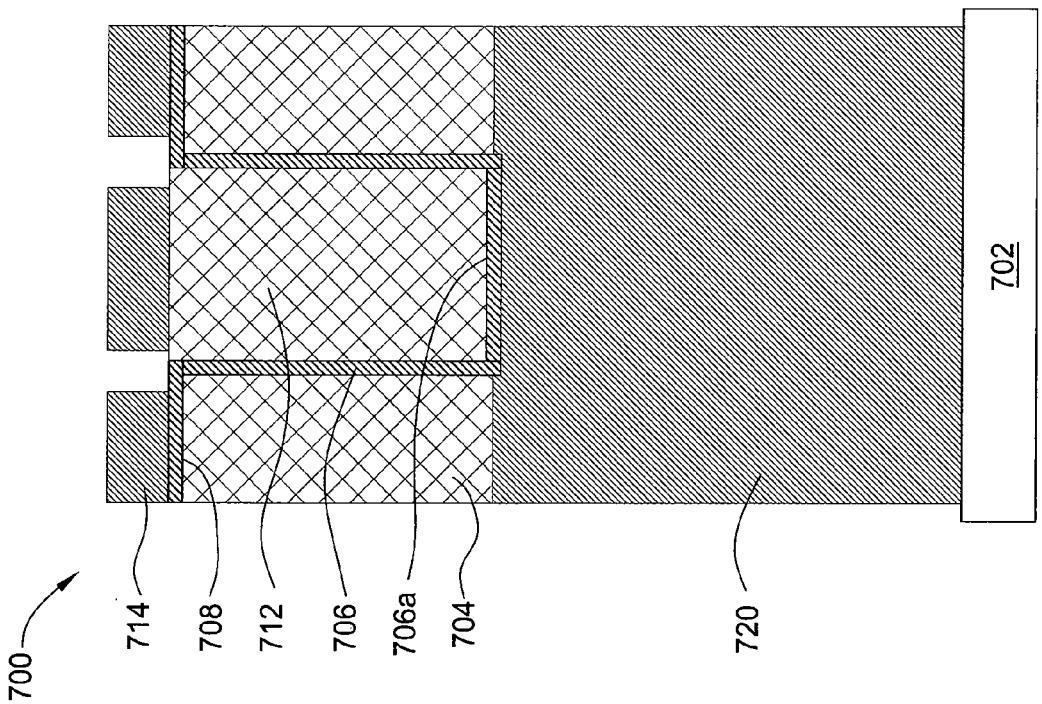

US 7,755,921 B2

METHOD AND APPARATUS FOR FABRICATING SUB-LITHOGRAPHY DATA TRACKS FOR USE IN MAGNETIC SHIFT REGISTER MEMORY DEVICES

BACKGROUND OF THE INVENTION

The present invention relates generally to memory storage systems, and relates more particularly to memory storage systems that use the magnetic moment of magnetic domains to store data.

SUMMARY OF THE INVENTION

In one embodiment, the invention is a method and apparatus for fabricating sub-lithography data tracks for use in magnetic shift register memory devices. One embodiment of a memory device includes a first stack of dielectric material formed of a first dielectric material, a second stack of dielectric material surrounding the first stack of dielectric material and formed of at least a second dielectric material, and at least one data track for storing information, positioned between the first stack of dielectric material and the second stack of dielectric material, the data track having a high aspect ratio and a substantially rectangular cross section.

BRIEF DESCRIPTION OF THE DRAWINGS

So that the manner in which the above recited features of the present invention can be understood in detail, a more particular description of the invention may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 7A-7C illustrate a second embodiment of a method for fabricating a magnetic data tracks.

DETAILED DESCRIPTION

In one embodiment, the present invention is a method and apparatus for fabricating sub-lithography data tracks for use in magnetic shift register memory devices. Embodiments of the present invention allow for bottom-up ferromagnetic material deposition or electrochemical plating to form compositionally modulated magnetic data tracks. This allows for formation of very high aspect ratio rectangular trenches, where the larger dimension of the rectangle is defined by conventional lithography and the smaller dimension of the rectangle is defined by the thickness of a conformal coating of a sacrificial material in a larger trench.

Semiconductor magnetoresistive random access memory (MRAM) encodes data bits in a ferromagnetic material by utilizing the direction of the ferromagnetic material's magnetic moment. Atoms in ferromagnetic materials respond to external magnetic fields (generated by applying current to the data track) by aligning their magnetic moments to the direction of the applied magnetic field. In a magnetic material with domain walls, a current passed across the domain walls moves the domain walls in the direction of the current flow. As the current passes through a domain, the current becomes "spin polarized". When this spin-polarized current passes into the next domain across the intervening domain wall, the spin-polarized current develops a spin torque. This spin torque moves the domain wall. Domain wall velocities can be very high (i.e., on the order of one hundred to several hundred meters per second), so that the process of moving a particular domain to the required position for the purposes of reading the domain or for changing the domain's magnetic state by means of the writing element can be very short.

When the applied magnetic field is removed, the atoms' magnetic moments remain aligned in the induced direction. A magnetic field applied in a second, opposite direction causes the atoms to realign themselves with the second direction. Typically, the magnetic moments of the atoms within a volume of the ferromagnetic material are aligned parallel to each other by a magnetic exchange interaction. The atoms then respond together (e.g., as one macro-magnetic moment, or magnetic domain) to the external magnetic field.

Figures 1A, 1B:
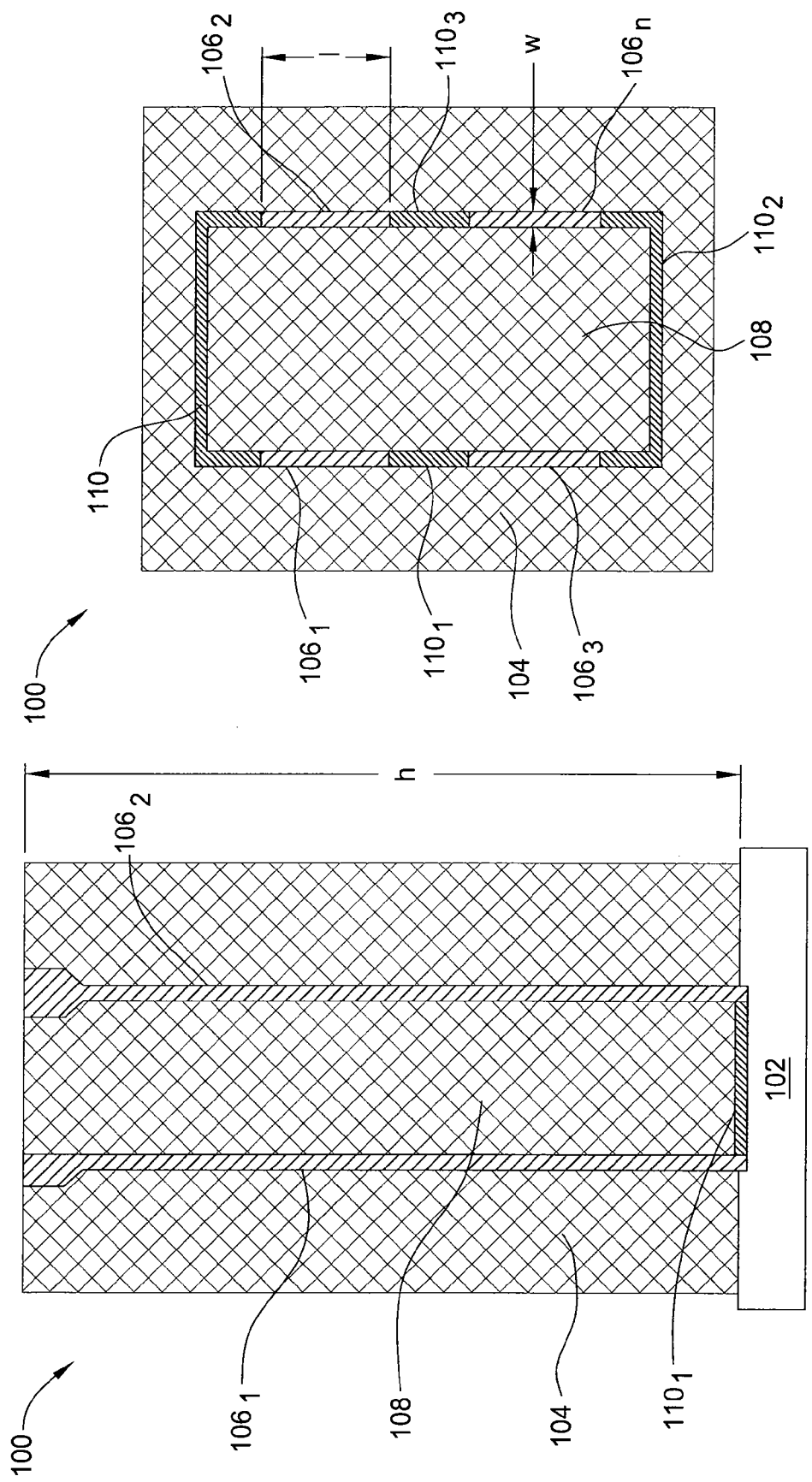
FIG. 1A illustrates a cross-sectional view of an interconnect structure containing at least one magnetic data track, according to the present invention.
FIG. 1B is a top view of the magnetic data track of FIG. 1.

FIG. 1A illustrates a cross-sectional view of an interconnect structure (or a region of an interconnect structure) 100 containing at least one conducting element, such as at least one magnetic data track $106_1$-$106_n$ (hereinafter collectively referred to as "magnetic data tracks 106"), according to the present invention. FIG. 1B illustrates a top view of the interconnect structure 100 of FIG. 1. Referring simultaneously to FIGS. 1A and 1B, the interconnect structure 100 comprises a substrate 102, at least one data track 106 with sub-lithographic dimensions formed on the substrate 102, an outer stack 104 of dielectric materials formed on the substrate 102 and surrounding the data tracks 106, and inner stack 108 of dielectric material formed on the substrate 102 and surrounded by the data tracks 106 (i.e., such that the data tracks 106 are positioned between the inner stack 108 of dielectric material and the outer stack 104 of dielectric material). In one embodiment, the interconnect structure 100 further comprises at least one thin layer $110_1$-$110_n$ (hereinafter collectively referred to as "thin layers 110") of material formed on the substrate 102 between two or more data tracks 106.

As illustrated in FIG. 1B, the data tracks 106 that are formed on the substrate 102 have a high aspect ratio (height: width) and a substantially rectangular cross section that is defined by the length, l, and the width, w. In one embodiment, the aspect ratio of the data tracks 106 is greater than approximately 10:1. In a further embodiment, the aspect ratio is greater than or equal to approximately 100:1. In a further embodiment, the aspect ratio is greater than approximately 200:1. In a further embodiment still, the aspect ratio is greater than approximately 500:1. For instance, in one embodiment, the data tracks 106 have a width of approximately fifty nanometers, a length of approximately two hundred nanometers, and a height, h, of approximately five microns. In one embodiment, ranges for each dimension are: width approximately one to one hundred nanometers; length approximately fifty to eight hundred nanometers; and height approximately one to one hundred microns. In one embodiment, one of the length and the width is between approximately ten and eighty nanometers.

In one embodiment, the data tracks 106 further comprise connections at the top (i.e., far end relative to the substrate 102) and bottom (i.e., near end relative to the substrate 102) of the data tracks 106. The connections allow current to pass through the data tracks 106, enabling shifting of the magnetic domains in the data tracks 106.

In one embodiment, the data tracks 106 are comprised of a ferromagnetic and/or ferrimagnetic material. The data tracks 106 can be magnetized in small sections, or domains, in one direction or another. Information is stored in regions (e.g., domains) in the data tracks 106. The order parameter of the magnetic material from which the data tracks 106 are fabricated (i.e., the magnetization direction or the direction of the magnetic moment) changes from one direction to another. This variation in the direction of the magnetic moment forms the basis for storing information in the data tracks 106.

The outer stack 104 of dielectric materials comprises a plurality of layers of dielectric materials. In one embodiment, the plurality of layers is formed from at least a first dielectric material. The inner stack 108 of dielectric material comprises a second dielectric material. In one embodiment, the first and second dielectric materials have the same chemical composition and/or material properties. In another embodiment, the first and second dielectric materials have different chemical compositions and/or material properties. In one embodiment, at least one of the first and second dielectric materials comprises at least one of: a silicon oxide, a silicon nitride, a silicon carbide, a low k dielectric material, or a low k dielectric material containing porosity and/or air gaps. In one embodiment, at least one of the outer stack 104 and the inner stack 108 contains conducting lines and/or via interconnect structures. In another embodiment, at least one of the outer stack 104 and the inner stack 108 contains magnetic tunnel junction devices. In another embodiment, at least one of the outer stack 104 and the inner stack 108 contains reading devices and/or writing devices positioned proximate to the data tracks 106. The writing devices can be used to write magnetic domain walls into the data tracks 106, while the reading devices can be used to read the magnetic domains in the data tracks 106.

In one embodiment, the thin layers 110 of material are formed of a material that can be removed selectively to the first and second dielectric materials. In one embodiment, the thin layers 110 of material are formed from at least one of: a carbon-containing material, a silicon-containing material, a plasma enhanced chemical vapor deposition (PECVD) deposited materials, an atomic layer deposition (ALD) deposited material, or any material that can be removed selectively to the first and second dielectric materials. As illustrated in FIG. 1B, the thin layers 110 of material are disposed along the shorter side (i.e., along the width) of the data tracks 106.

To write data in a specific domain, a current is applied to the magnetic data tracks 106 to move the domain over and into alignment with a writing device. All of the domains in a data region move when the current is applied to the magnetic data tracks 106. The movement of the domains is controlled by the magnitude and the direction of the applied current, and by the time over which the current is applied.

To read data in a specific domain, additional current is applied to the magnetic data tracks 106 to move the domain over and into alignment with a reading device. A larger shifted portion of the data region is pushed (e.g., shifted or moved) into a reservoir.

The reading device and the aforementioned writing device form part of a control circuit that defines a reference plane in which the reading device and writing device are arrayed. To operate the magnetic data tracks 106, the control circuit comprises, in addition to the reading element and writing devices, logic and other circuitry for a variety of purposes, including: the operation of the reading element and writing devices, the provision of current pulses to move the domains within the magnetic shift register, and the means of coding and decoding data in the magnetic data tracks 106. In one embodiment, the control circuit is fabricated using complementary metal-oxide-semiconductor (CMOS) processes on a silicon wafer. In one embodiment, the region of he interconnect structure 100 containing the magnetic data tracks 106 is designed to have a small footprint on the silicon wafer, so as to maximize the storage capacity of the memory device while minimizing the cost due to usage of the silicon area.

Figure 2:
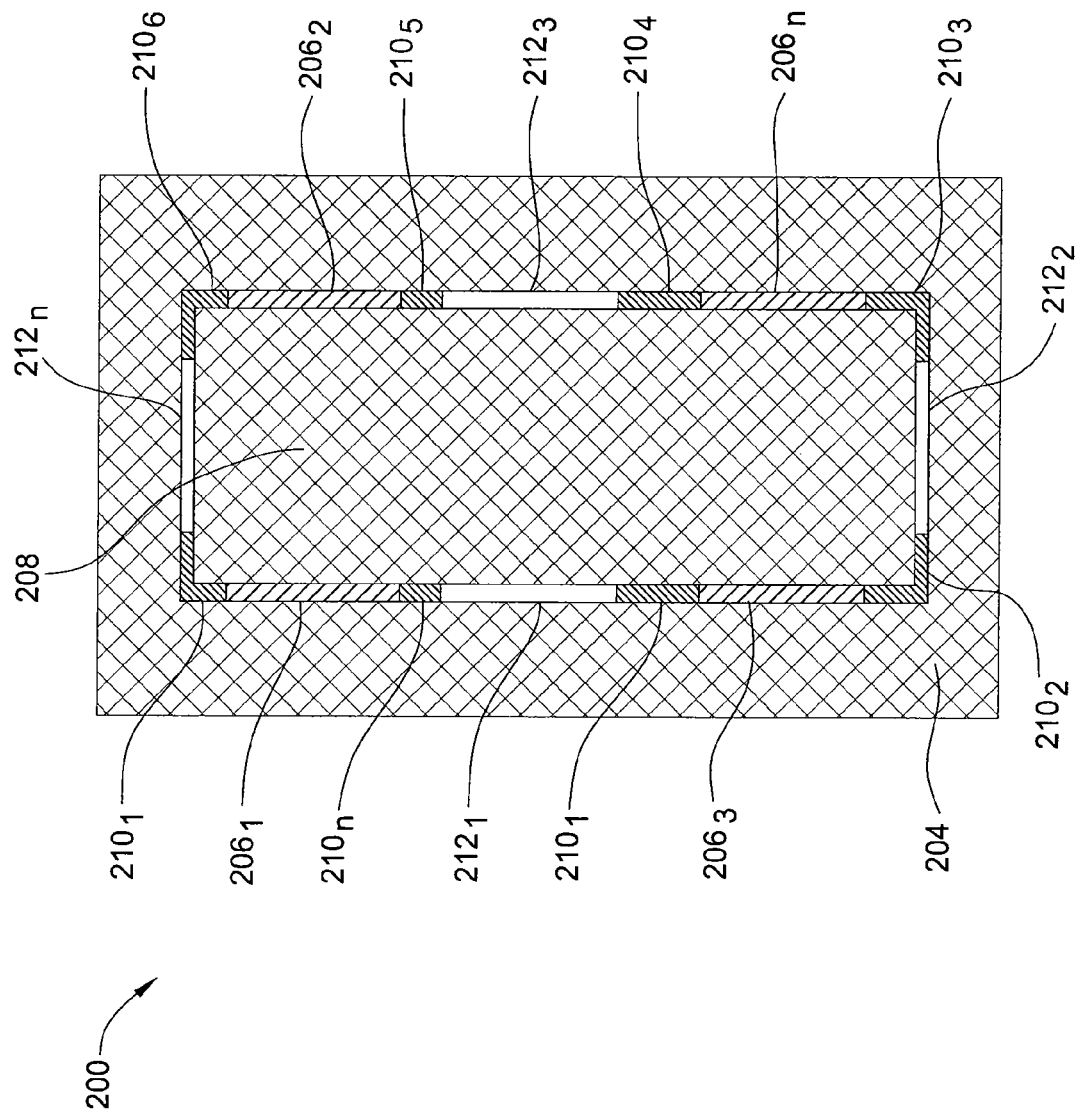
FIG. 2 is a top view of a second embodiment of a region of an interconnect structure containing at least one magnetic data track, according to the present invention.

FIG. 2 illustrates a top view of a second embodiment of a region of an interconnect structure 200 containing at least one magnetic data track $206_1$-$206_n$ (hereinafter collectively referred to as "data tracks 206"), according to the present invention. The interconnect structure 200 is configured in a manner similar to the interconnect structure 100 illustrated in FIG. 1B and comprises a substrate (not shown), at least one data track 206 formed on the substrate 202, an outer stack 204 of dielectric materials formed on the substrate 202 and surrounding the data tracks 206, and inner stack 208 of dielectric material formed on the substrate 202 and surrounded by the data tracks 206, and at least one thin layer $210_1$-$210_n$ (hereinafter collectively referred to as "thin layers 210") of material formed on the substrate 202 between two or more data tracks 206. Unlike the interconnect structure 100, the interconnect structure 200 further comprises insulator regions $212_1$-$212_n$ (hereinafter collectively referred to as "insulator regions 212") disposed between adjacent data tracks 206. Specifically, the air gap regions 212 are disposed between adjacent thin layers 210 of material or adjacent data tracks 206. The isolation provided by the insulator regions 212 is necessary if the material comprising the thin layers 210 of material is electrically conducting. In one embodiment, the insulating regions 212 comprise air gaps. In another embodiment, the insulating regions 212 are at least partially filled with a dielectric material which may contain air gaps.

Figure 3:
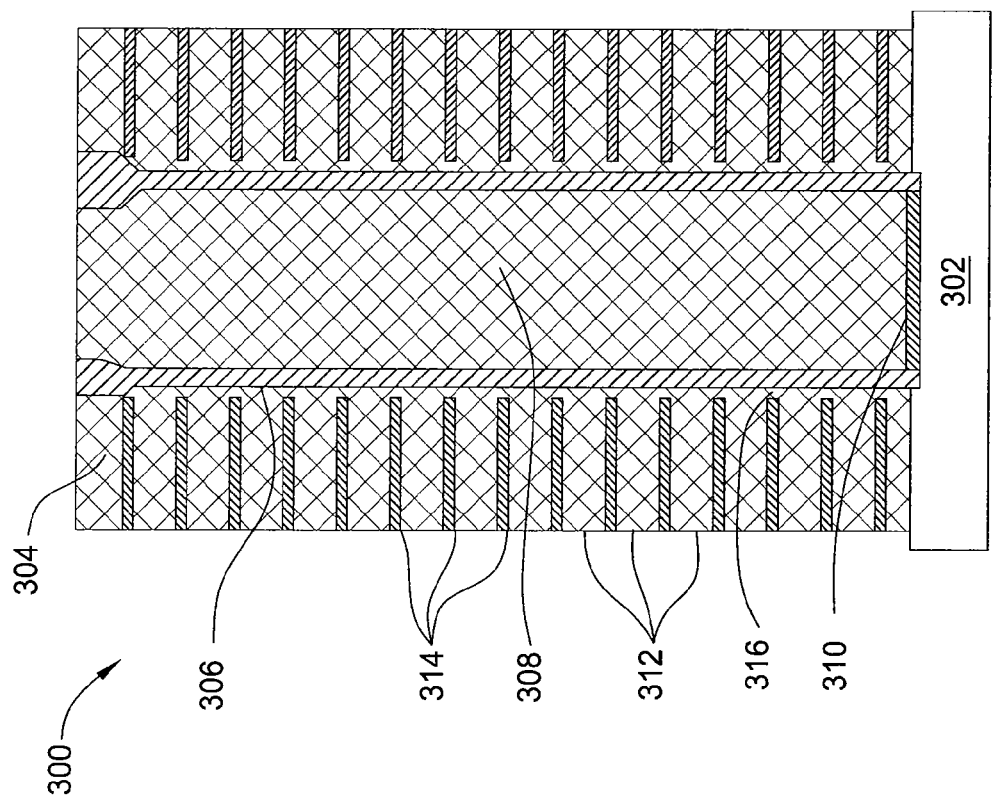
FIG. 3 is a cross-sectional view of a third embodiment of a region of an interconnect structure containing at least one magnetic data track, according to the present invention.

FIG. 3 illustrates a cross-sectional view of a third embodiment of a region of an interconnect structure 300 containing at least one magnetic data track 306, according to the present invention. Note that in FIG. 3, reference numerals have only been used on one half of the substantially symmetric illustration for clarity's sake. The interconnect structure 300 is configured in a manner similar to the interconnect structure 100 illustrated in FIG. 1A and comprises a substrate 302, at least one data track 306 formed on the substrate 302, an outer stack 304 of dielectric materials formed on the substrate 302 and surrounding the data track 306, and inner stack 308 of dielectric material formed on the substrate 302 and surrounded by the data track 306, and a connector 310 formed on the substrate 302 to connect multiple data tracks 306.

In the embodiment illustrated in FIG. 3, the outer stack 304 of dielectric materials comprises regularly alternating layers of a first dielectric material 312 and a third dielectric material 314, where the third dielectric material 314 has been isotropically etched to recess the third dielectric material 314 slightly in the data track 306, creating physical "notches" 316 in the data track 306. These notches may be used to pin magnetic domain walls. In one embodiment, the magnetic data track 306 comprises a substantially homogeneous material. Within the context of the present invention, a "homogeneous" magnetic material is a contiguous volume of magnetic material that may have a complex shape and that nominally has the same magnetic properties (e.g., magnetization, magnetic anisotropy, magnetic exchange, magnetic damping) throughout the volume. In one embodiment, the homogeneous material is a ferromagnetic or ferrimagnetic material selected from the group including, but not limited to: a permalloy, a nickel-iron alloy, a cobalt-iron alloy, an alloy formed from one or more of: nickel, cobalt and iron, or an alloy formed from one or more of: nickel, cobalt and iron plus other elements, including, but not limited to: boron, zirconium, hafnium, chromium, palladium, or platinum.

In one embodiment, the first, second, and third dielectric materials have the same chemical composition and/or material properties. In another embodiment, the first, second, and third dielectric materials have different chemical compositions and/or material properties. In one embodiment, at least one of the first, second, and third dielectric materials comprises at least one of: a silicon oxide, a silicon nitride, a silicon carbide, a low k dielectric material, or a low k dielectric material containing porosity or air gaps.

Figure 4:
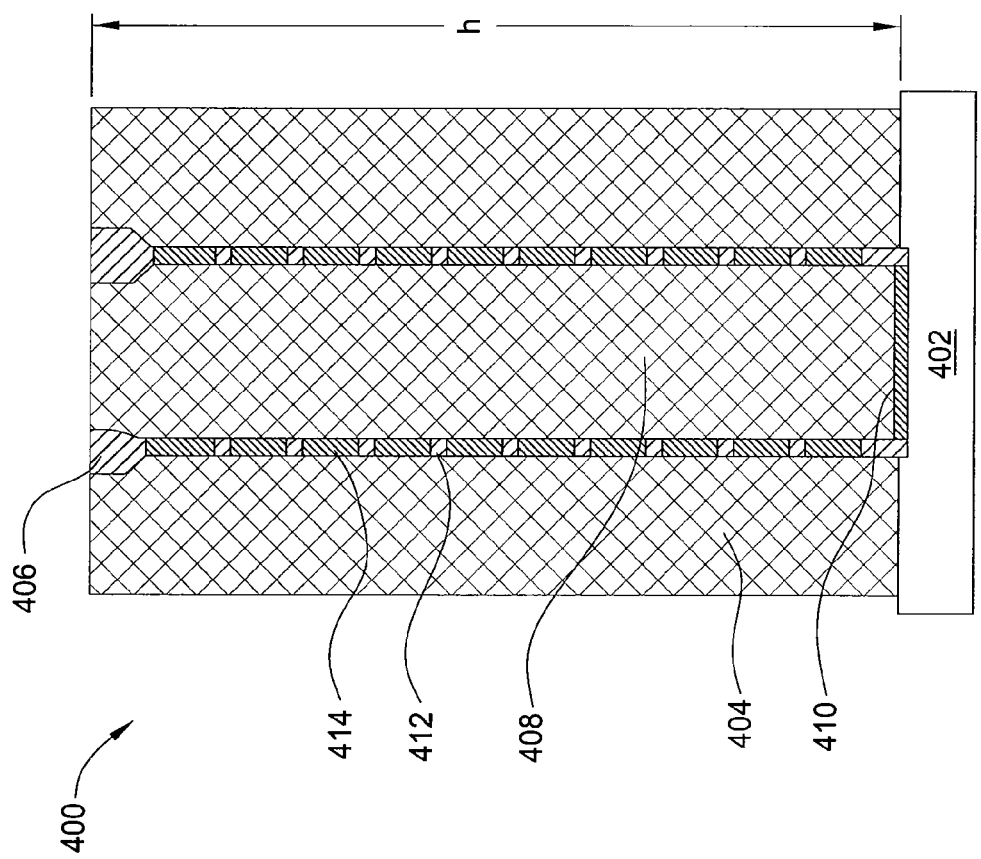
FIG. 4 is a cross-sectional view of a fourth embodiment of a region of an interconnect structure containing at least one magnetic data track, according to the present invention.

FIG. 4 illustrates a cross-sectional view of a fourth embodiment of a region of an interconnect structure 400 containing at least one magnetic data track 406, according to the present invention. Note that in FIG. 4, reference numerals have only been used on one half of the substantially symmetric illustration for clarity's sake. The interconnect structure 400 is configured in a manner similar to the interconnect structure 100 illustrated in FIG. 1A and comprises a substrate 402, at least one data track 406 formed on the substrate 402, an outer stack 404 of dielectric materials formed on the substrate 402 and surrounding the data track 406, and inner stack 408 of dielectric material formed on the substrate 402 and surrounded by the data track 406, and a thin layer 410 of material formed on the substrate 402 between two or more data tracks 406.

In the embodiment illustrated in FIG. 4, the data track 406 comprises a plurality of inhomogeneous layers 412 and 414 comprising different magnetic materials or magnetic materials having different or modulated composition that form a multi-layered magnetic shift register. Within the context of the present invention, "inhomogeneous" magnetic material comprises a contiguous volume of magnetic material that may have a complex shape and whose magnetic properties (e.g., magnetization, magnetic anisotropy, magnetic exchange, magnetic damping) may vary throughout the volume (due, for example, to a change in magnetic material composition and/or due to some physical process during the deposition of this magnetic material or acting on the magnetic material after the magnetic material has been deposited). The different composition of the materials in the layers 412 and 414 creates local energy minima, similar to "potential wells", so that the domain walls between domains of opposite polarity will align themselves with the boundaries between the alternating magnetic layers 412 and 414. Thus, the extent and size of the domains are determined by the thicknesses of the magnetic layers 412 and 414.

In one embodiment, each of the magnetic layers 412 and 414 is comprised of one or more ferromagnetic or ferrimagnetic materials, where the ferromagnetic or ferrimagnetic materials are chosen appropriately based on one or more of: the magnitude of their magnetization (magnetic moment per unit volume), exchange parameter, magnetic anisotropy, and damping coefficient. The choice of materials for the magnetic layers 412 and 414 is also influenced by the materials' manufacturability and compatibility with the process used to fabricate the multi-layered magnetic shift register (i.e., data track 406). In one embodiment, each of the magnetic layers 412 and 414 comprises at least one of: a permalloy, a nickel-iron alloy, a cobalt-iron alloy, an alloy formed from one or more of nickel, cobalt, and iron, or an alloy formed from one or more of nickel, cobalt, and iron plus other elements, including, but not limited to: boron, zirconium, hafnium, chromium, palladium, or platinum. In one embodiment, the magnetic layers 412 and 414 have gradients in their compositions, or transition regions having compositions between the compositions of the magnetic layers 412 and 414 are disposed between the magnetic layers 412 and 414.

The materials comprising the magnetic layers 412 and 414 can be deposited by various methods, including, for example, electroless plating or electroplating. In one embodiment, the materials comprising the magnetic layers 412 and 414 are deposited in accordance with the electroless plating process described in U.S. Pat. No. 3,702,263, which is herein incorporated by reference. In another embodiment, the materials comprising the magnetic layers 412 and 414 are deposited in accordance with the electroplating process described in U.S. Pat. No. 4,315,985, which is herein incorporated by reference.

In the embodiment illustrated in FIG. 4, the height, h, of the data track 406 (i.e., the dimension extending in the direction away from the substrate 402) is between approximately one micron and approximately one hundred microns. In one embodiment, the cross-section of the vias or trenches into which the data tracks are deposited ranges between approximately ten nanometers by one hundred nanometers and approximately seventy nanometers by eight hundred nanometers. These vias or trenches are then filled with ferromagnetic and/or ferrimagnetic material to form the data regions (domains) and reservoir of the data track 406 of the multi-layered magnetic shift register.

As discussed above, a current pulse applied to the multi-layered magnetic data track 406 causes the domains to move in the direction of the applied current. However, unless the current pulse is of sufficient amplitude and duration, the domains may not move past the boundaries between the two different types of magnetic material in the magnetic layers 412 and 414 of the data track 406. Consequently, a domain can be moved one bit at a time, and the domains may be restricted from drifting past their desired positions.

In addition to pinning the possible locations of the domains, using different layers of magnetic material in the magnetic layers 412 and 414 of the data track 406 also allows higher tolerances for current amplitude and pulse duration. In this embodiment, the portion of the magnetic data track 406 that passes over the writing device and the reading device can be formed from a homogeneous magnetic material or from layers of different magnetic materials.

In one embodiment, the lengths of the alternating magnetic layers 412 and 414 are the same. In another embodiment, the lengths of the alternating magnetic layers 412 and 414 are different. In a further embodiment, the lengths of the alternating magnetic layers 412 and 414 vary throughout the multi-layered magnetic data track 400. In any case, the potential pins the domains in their defined positions against current induced motion induced by the current pulses.

Figure 5B:
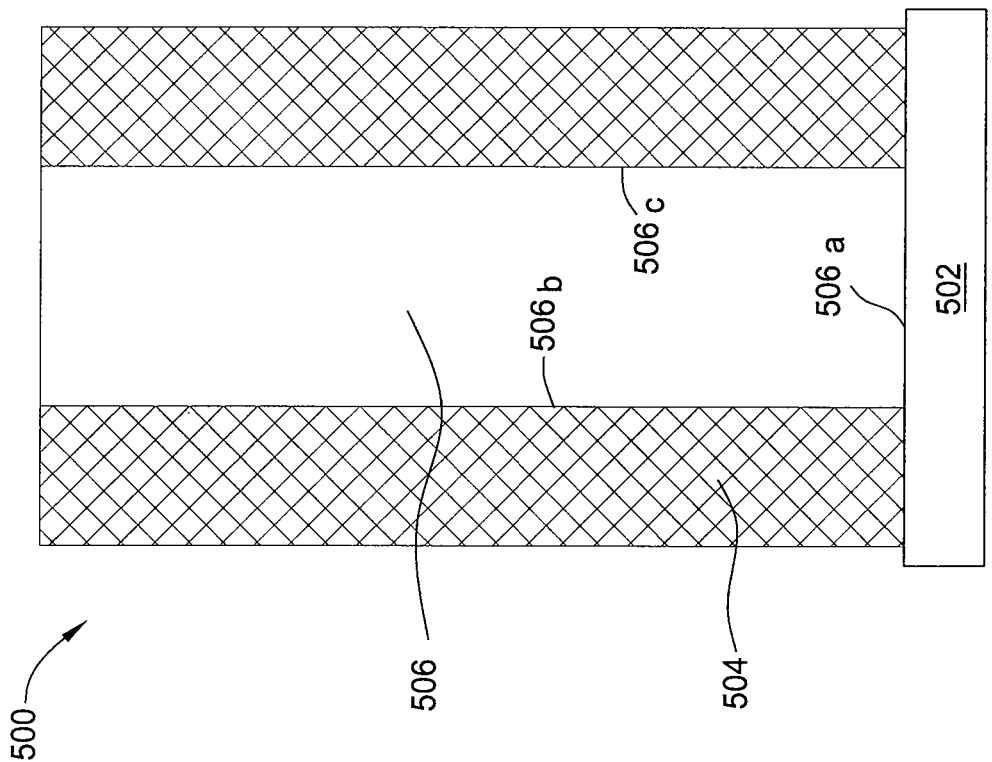
FIGS. 5A-5P illustrate one embodiment of a base method for fabricating any of the magnetic data tracks illustrated in FIGS. 1A-4.
Figure 5A:
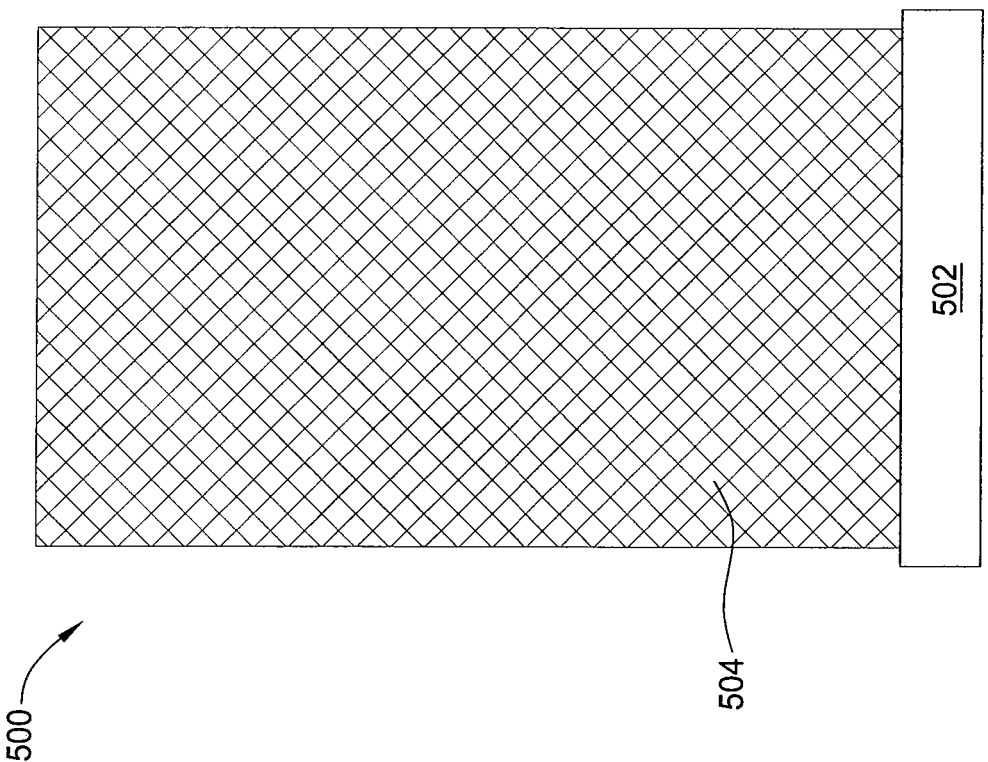
Figure 5D:
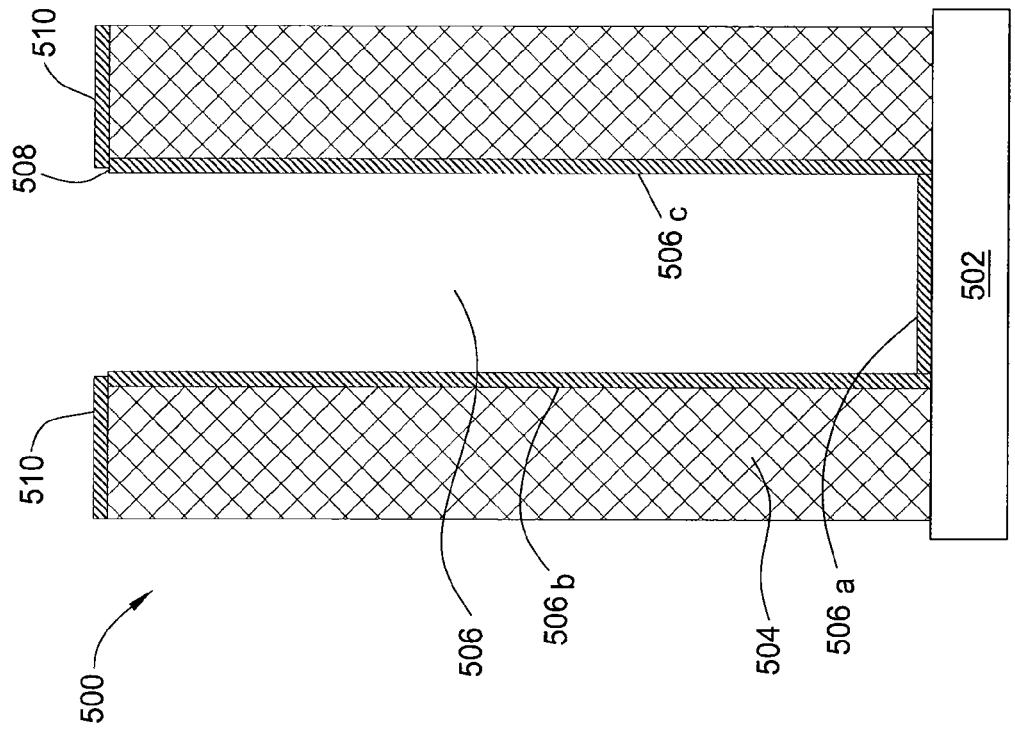
Figure 5C:
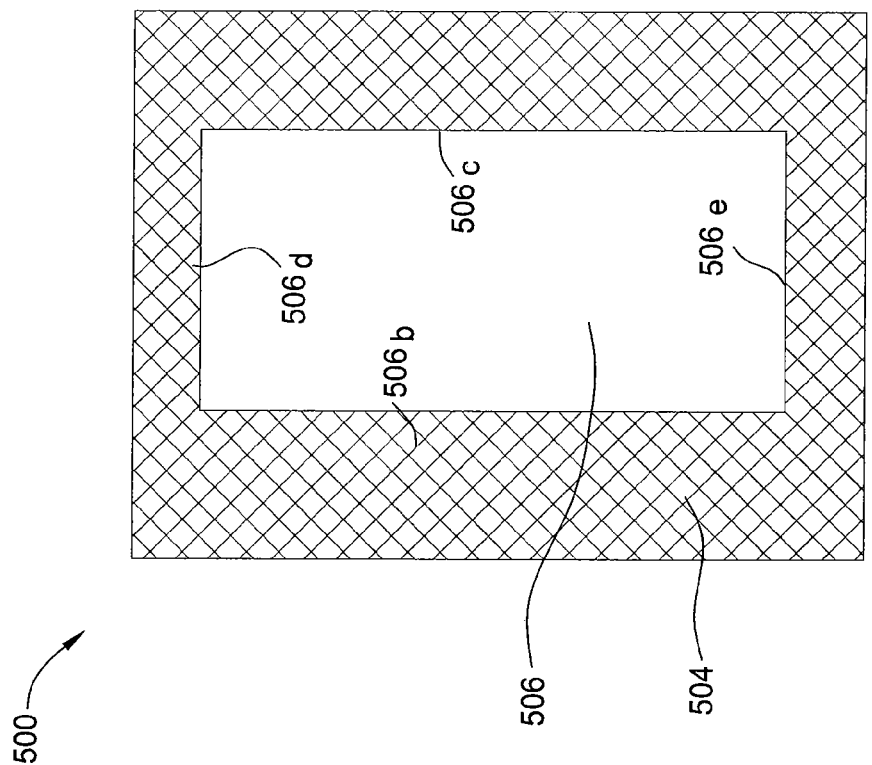
Figure 5F:
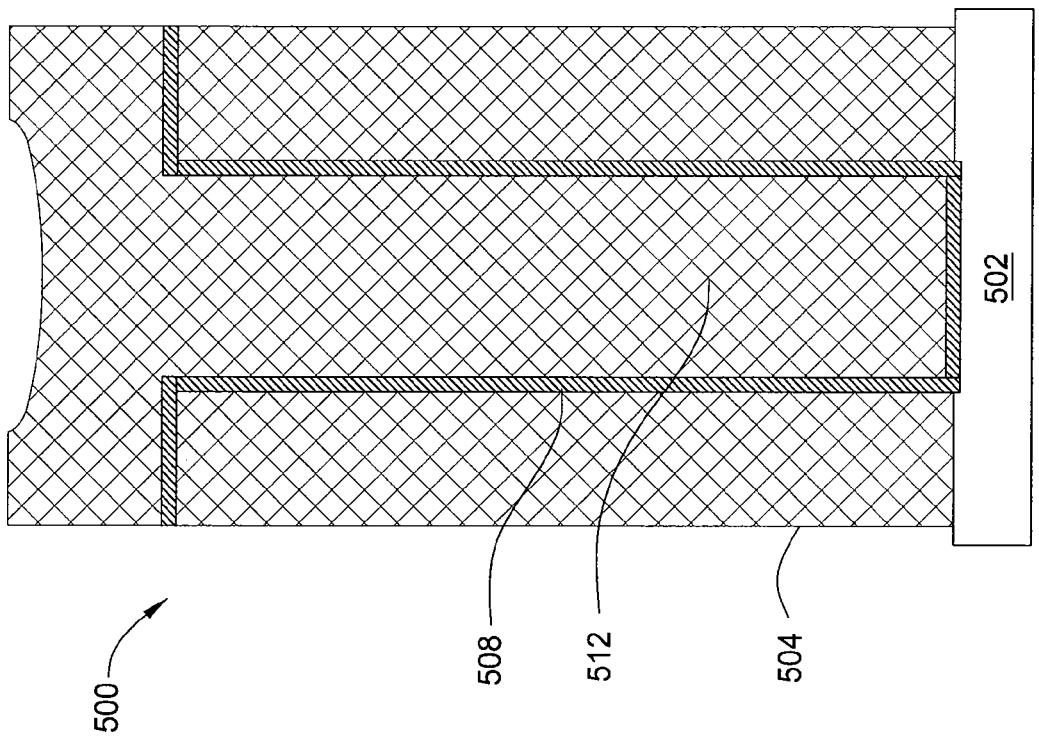
Figure 5E:
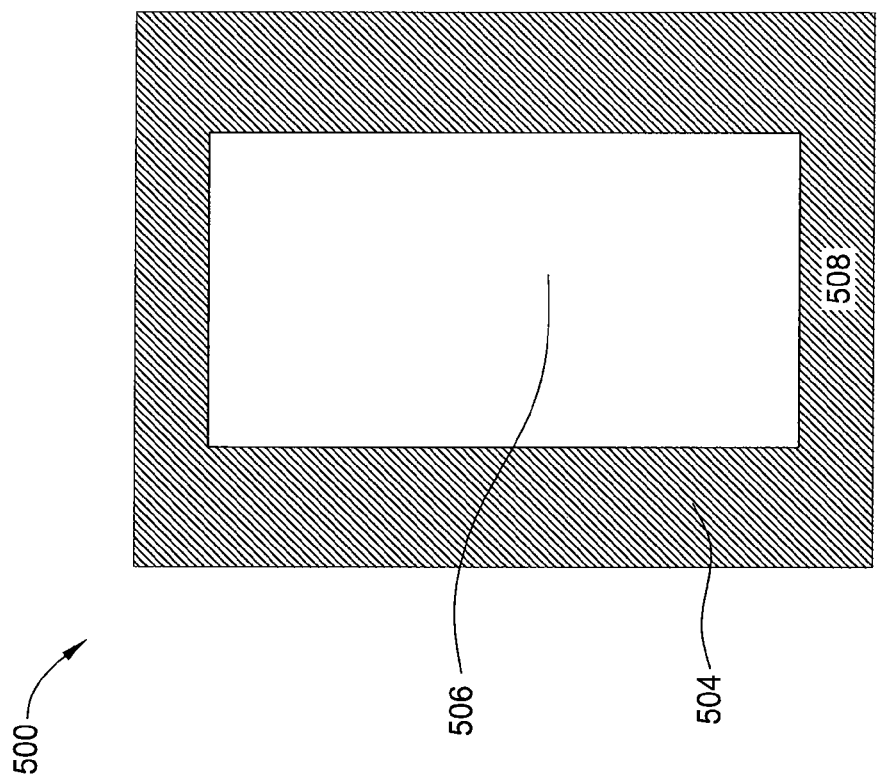
Figure 5H:
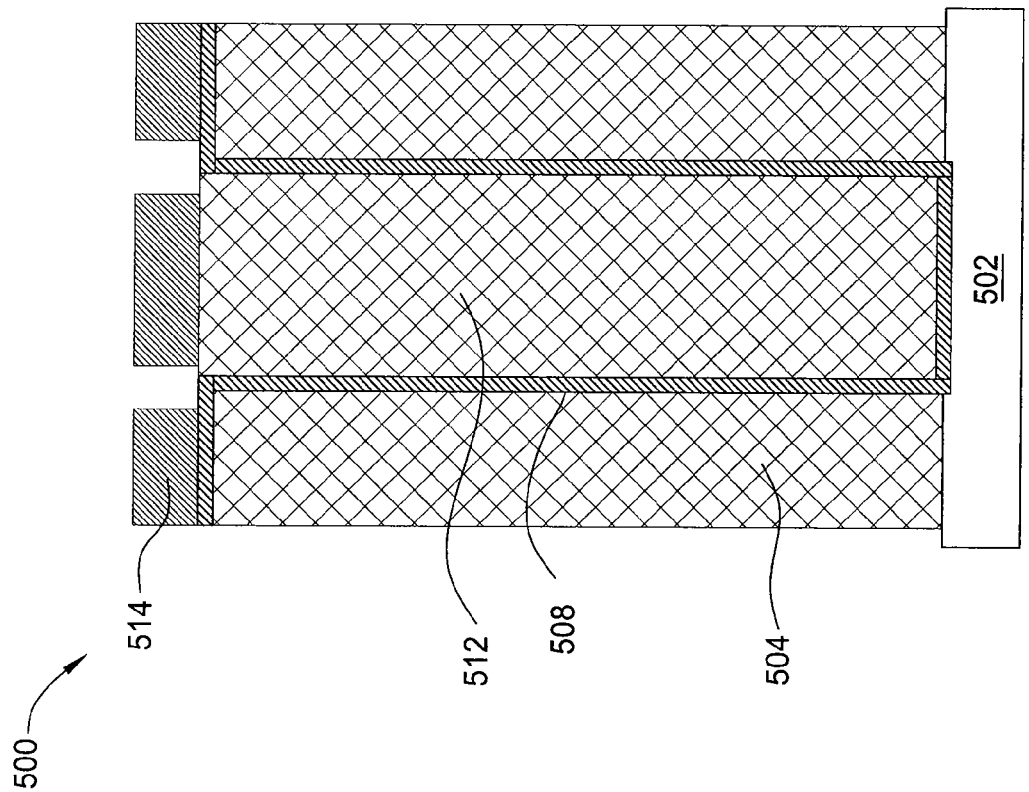
Figure 5G:
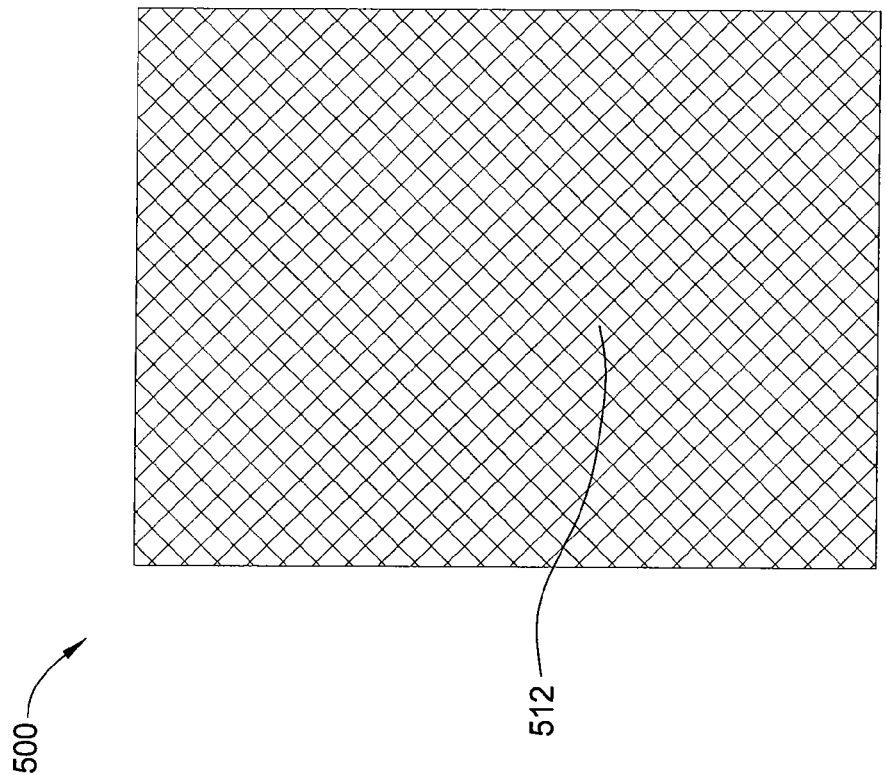
Figure 5J:
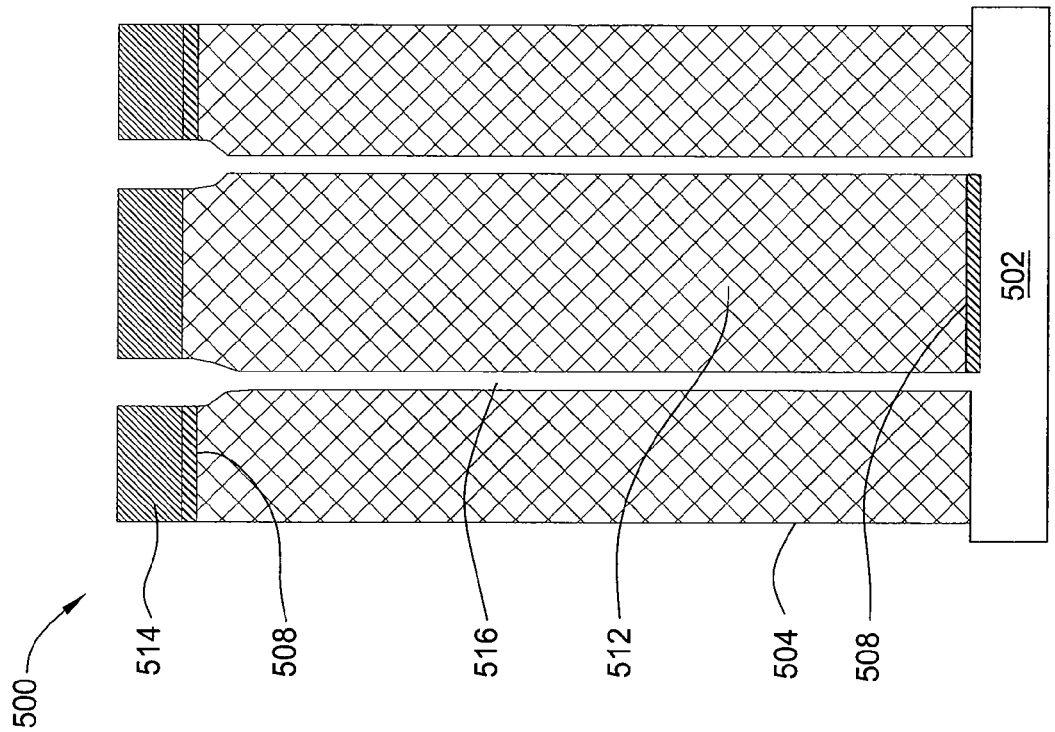
Figure 5I:
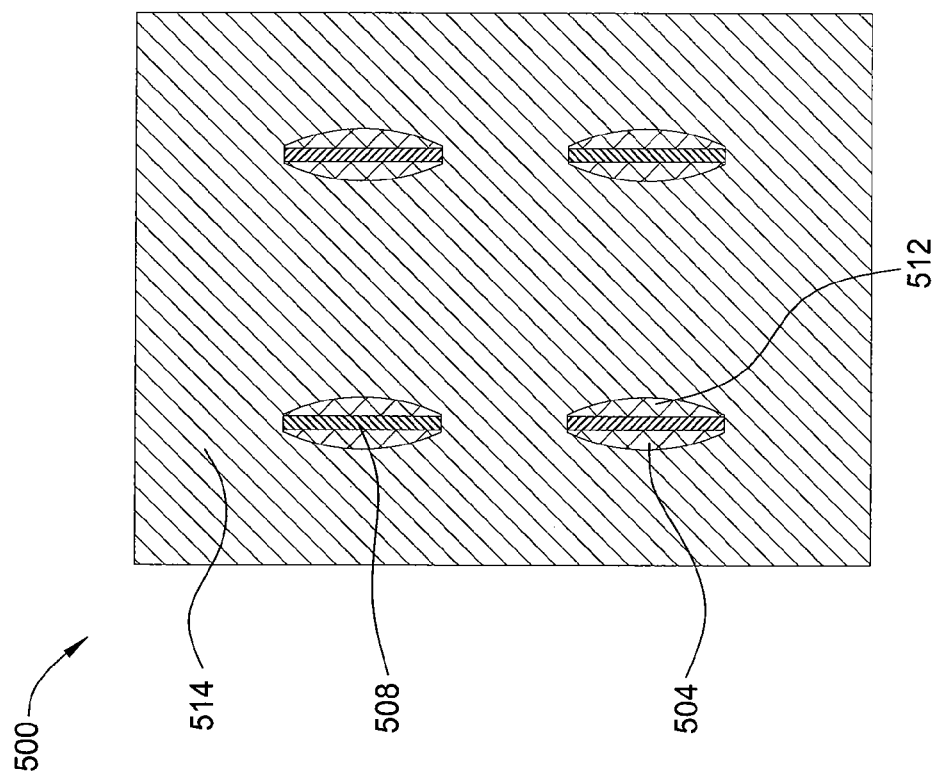
Figure 5L:
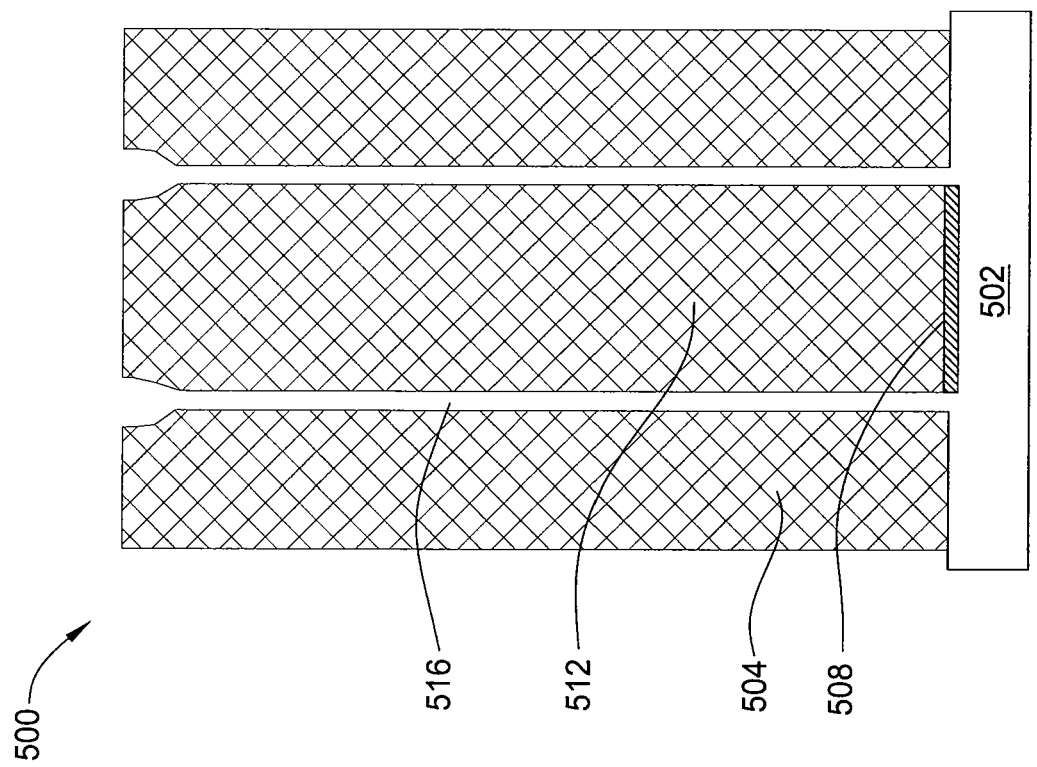
Figure 5K:
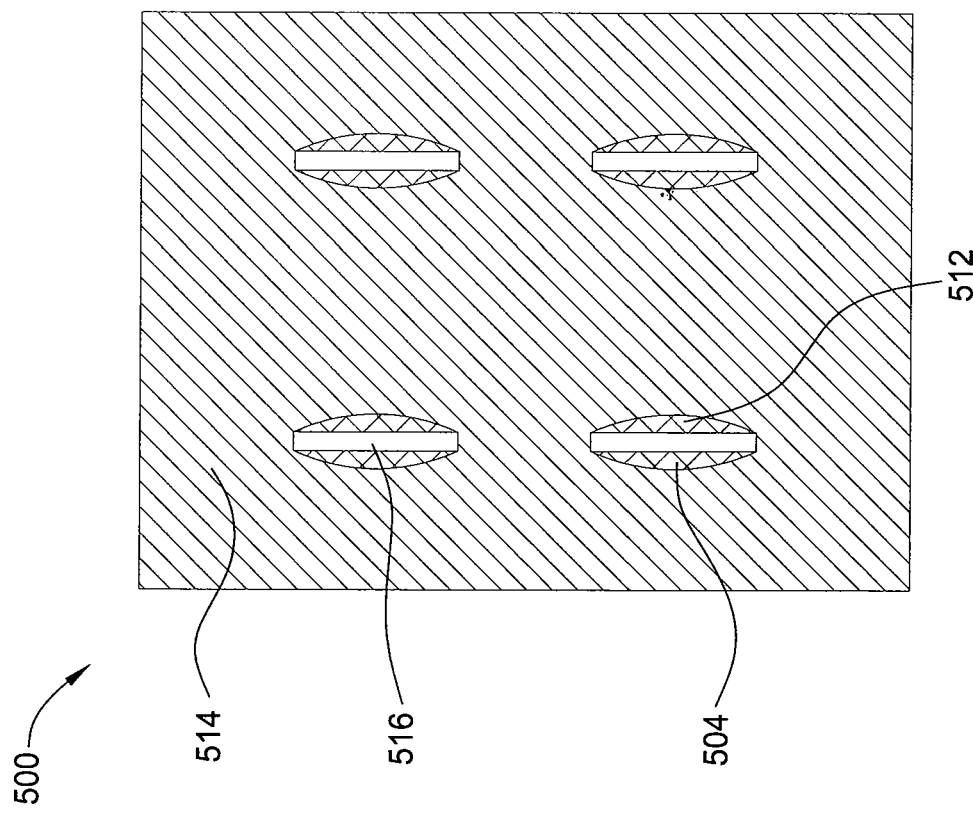
Figure 5N:
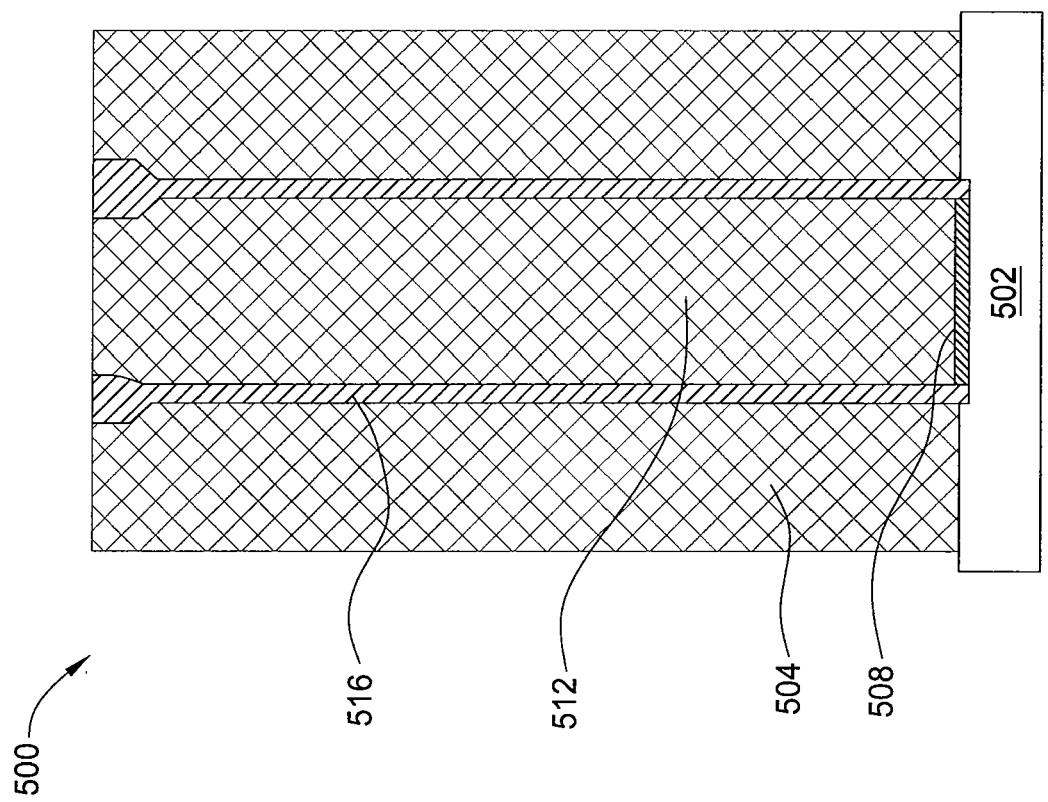
Figure 5M:
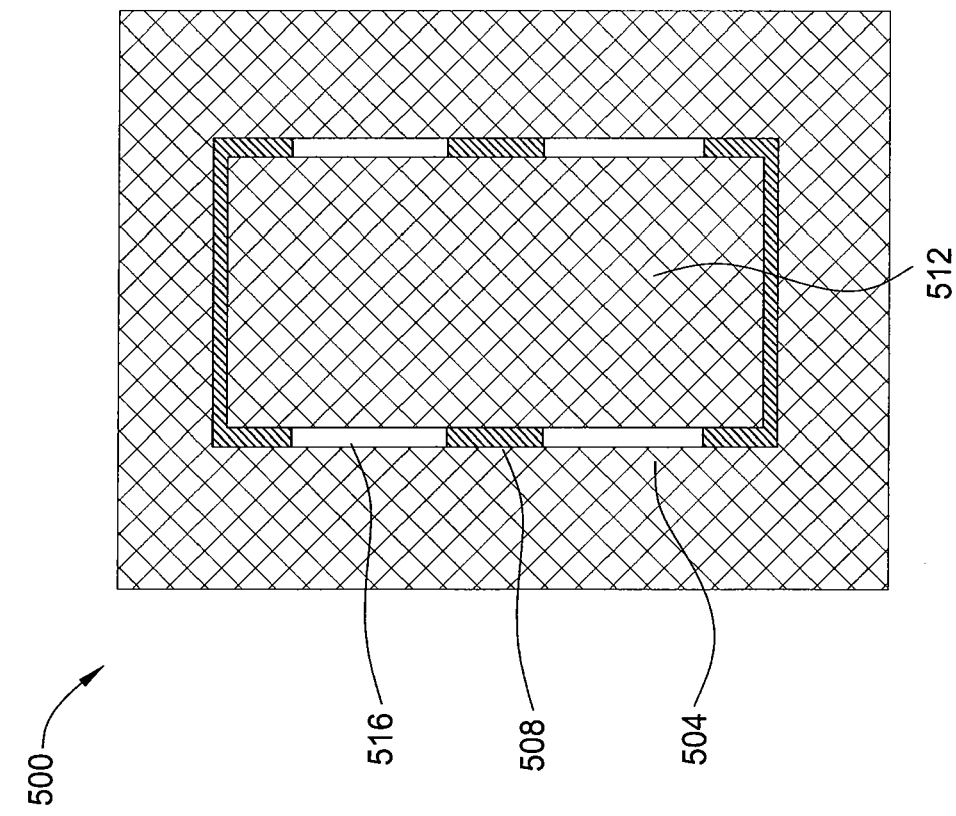
Figure 5P:
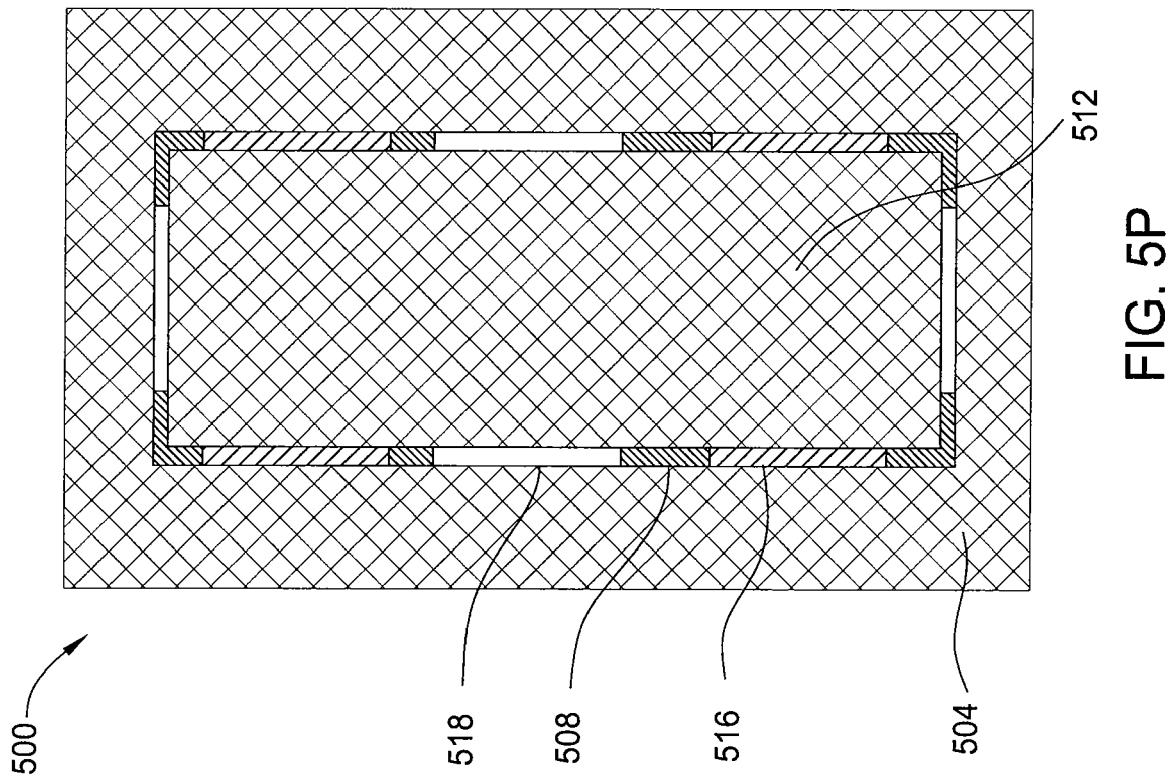

FIGS. 5A-5P illustrate one embodiment of a base method for fabricating any of the interconnect structures 100, 200, 300 or 400 containing magnetic data tracks illustrated in FIGS. 1A-4. Specifically, FIGS. 5A-5P illustrate cross-sectional and top views of the fabrication steps; as such, FIGS. 5A-5P also serve as a flow diagram for the method according to the present invention.

As illustrated in FIG. 5A, the first steps in fabricating an interconnect structure 500 containing magnetic data tracks include providing a substrate 502 and forming a multilayer stack 504 of dielectric materials on the substrate 502. As described above, the multilayer stack 504 of dielectric materials comprises at least a first dielectric material.

In FIGS. 5B and 5C, a large first trench 506 is patterned and etched into the multilayer stack 504 of dielectric materials. As illustrated, the first trench 506 is substantially rectangular in cross section and comprises a bottom 506a that contacts the substrate 502, and first, second, third and fourth sidewalls 506b, 506c, 506d, and 506e, respectively, disposed substantially perpendicular to the bottom 506a.

In FIGS. 5D and 5E, the first trench 506 is conformally coated with a thin layer 508 of sacrificial material that covers the bottom 506a and first, second, third and fourth sidewalls 506b, 506c, 506d, and 506e, of the first trench 506. In addition, the layer 508 of material covers the top 510 of the multilayer stack 504 of dielectric materials. In one embodiment, the sacrificial layer 508 is formed of a material that has an etch rate of at least five times higher than the etch rates of the dielectric materials forming the multilayer stack 504. In one embodiment, the sacrificial layer 508 is formed of at least one of: silicon; amorphous carbon film; carbon film; silicon carbon film; organic material; material containing silicon, oxygen, carbon, and hydrogen; metal film; film deposited by atomic layer deposition, film deposited by plasma enhanced chemical vapor deposition; and film deposited by solution deposition.

In FIGS. 5F and 5G, the first trench 506 is filled with a second dielectric material 512, such that the remainder of the multilayer stack 504 of dielectric materials becomes the outer stack of dielectric materials, and the second dielectric material 512 filling the first trench 506 becomes the inner stack of dielectric material. The inner stack 512 of dielectric material is formed inside and above the large first trench 506.

In FIGS. 5H and 5I, the top portion of the inner stack 512 of dielectric material (which is positioned above the first trench 506 and the thin layer 508 of sacrificial material) is removed to planarize the surface, exposing the top region of the first trench 506 (filled with the inner stack 512 of dielectric material) and either the thin layer 508 of sacrificial material or the top of the outer stack 504 of dielectric materials. A resist layer 514 is then deposited and patterned above the first, second, third and fourth sidewalls 506b, 506c, 506d, and 506e, of the first trench 506 over the exposed region of the layer 508 of material that is conformally coated in the large first trench 506.

In FIGS. 5J and 5K, the layer 508 of material that is conformally coated in the large first trench 506 is etched with an etch chemistry that removes the layer 508 of material much faster than the first or second dielectric materials, creating a narrow, rectangular second trench 516 with sub-lithographic dimensions. In one embodiment, the dimensions of the second trench 516 are such that at least one of the length and width of the second trench's cross section is less than approximately eighty nanometers. In another embodiment, at least one of the length and width of the second trench's cross section is between approximately five nanometers and seventy nanometers.

In FIGS. 5L and 5M, the second trench 516 is etched, stopping on the substrate 502. The substrate 502 includes contacts (not shown) to provide electrical connection to the bottom of the second trench 516. The contacts comprise standard conducting lines and/or vias that are used in interconnect structures. In one embodiment, the remainder of the thin layer 508 of sacrificial material remains as part of the interconnect structure. In a further embodiment, the remainder of the thin layer 508 of sacrificial material has insulating properties that prevent current from passing from one data track to another. In another embodiment, where the interconnect structure design requires current to pass from one data track to another, the remainder of the thin layer 508 of sacrificial material has conducting properties.

Figure 5O:
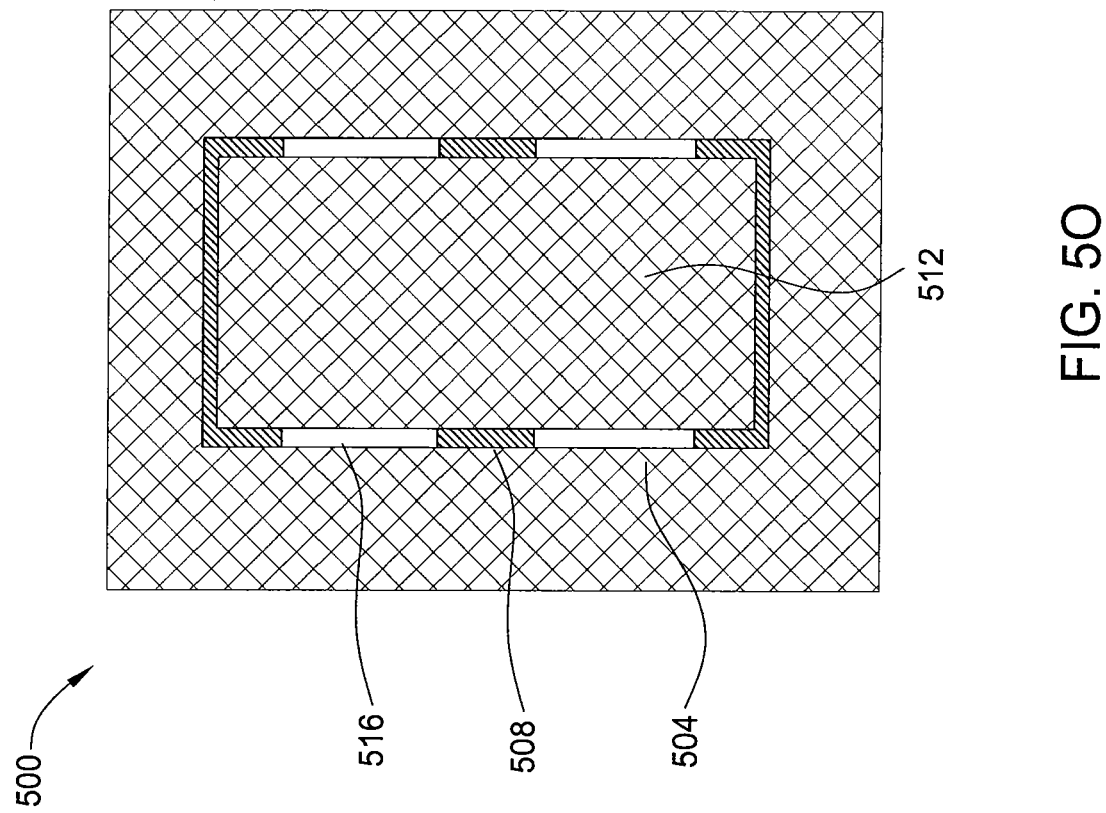

In FIGS. 5N and 5O, the narrow second trench 516 is filled with a ferromagnetic or ferrimagnetic material. In one embodiment, the ferromagnetic or ferrimagnetic material filling the second trench 516 comprises a single ferromagnetic or ferrimagnetic material (e.g., as illustrated in FIG. 1A). In an alternative embodiment, the ferromagnetic or ferrimagnetic material filling the second trench 516 comprises a composition of two or more ferromagnetic or ferrimagnetic materials (e.g., as illustrated in FIG. 4). This creates the data track. Contacts can be formed above the data track through standard interconnect wiring levels containing conducting lines and/or conducting vias. In one embodiment, the remainder of the layer 508 of sacrificial material that coated the first trench 506 comprises an insulting material that does not allow current to pass between neighboring data tracks. In a second embodiment, the remaining dielectric material is removed above the outer stack 504 of dielectric material during the planarization of the inner stack 512 of dielectric material prior to formation of the resist in FIG. 5H. In this embodiment, illustrated in FIG. 5P, at least some of the high aspect ratio second trenches 516 (i.e., the second trenches 516) are selectively filled, and other second trenches 516 having smaller aspect rations are left unfilled to act as electrically insulating isolation trenches 518.

Figure 6B:
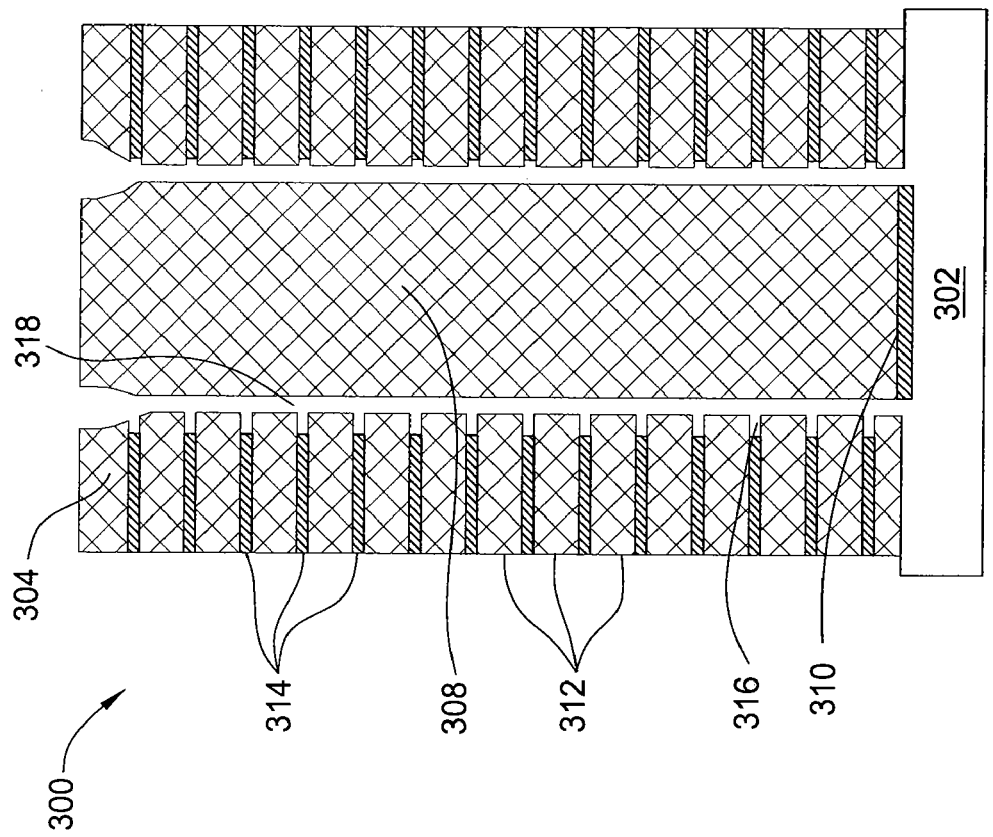
FIGS. 6A-6B illustrate one embodiment of a method for fabricating the magnetic data track illustrated in FIG. 3.
Figure 6A:
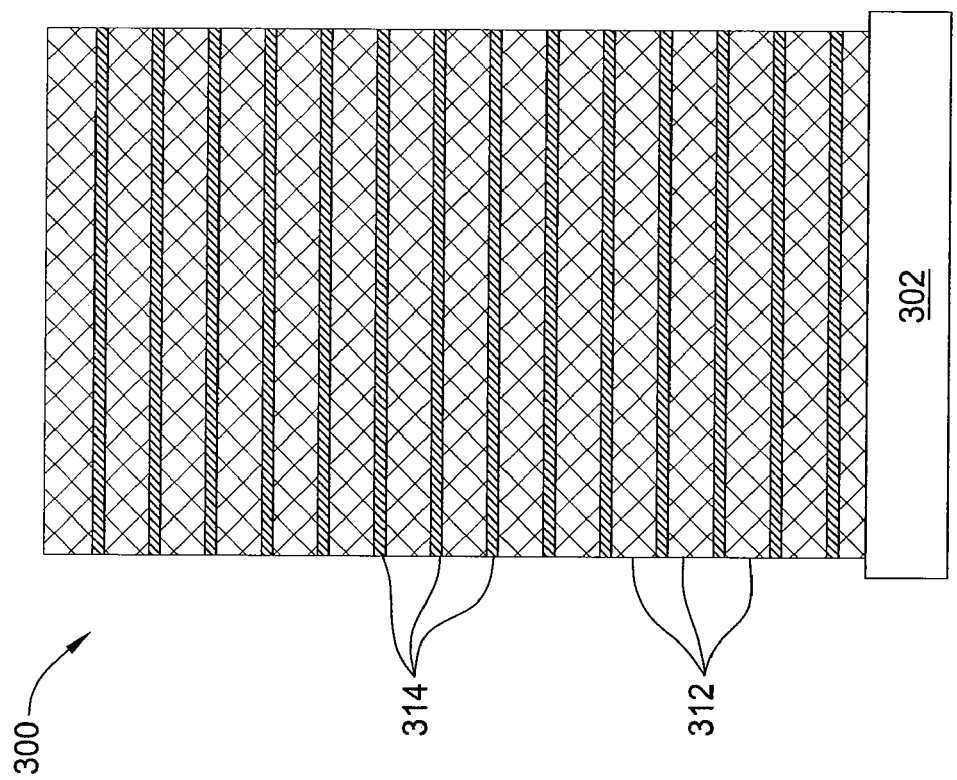

FIGS. 6A-6B illustrate one embodiment of a method for fabricating the magnetic data track 600 illustrated in FIG. 3. Specifically, FIG. 6A presents a replacement of FIG. 5A, thereby adapting the method depicted in FIGS. 5A-P for the fabrication of the magnetic data track 300 illustrated in FIG. 3.

As illustrated in FIG. 6A, the multilayer stack 304 of dielectric materials is formed on the substrate 302. As described above with respect to FIG. 3, the multilayer stack 304 of dielectric materials comprises, in this embodiment, regularly alternating layers of the first dielectric material 312 and the third dielectric material 314.

As illustrated in FIG. 6B, the rest of the steps depicted in FIGS. 5B-5M are then carried out, with the multilayer stack of the first and third dielectric materials 312 and 314 replacing the multilayer stack 504 of dielectric material illustrated in FIGS. 5B-5P. The resultant structure, illustrated in FIG. 6B, includes the inner stack 308 of dielectric material (comprising the second dielectric material), the second trench 318, and the notches 316 isotropically etched to recess the third dielectric material 314 slightly in the second trench 318. In a different embodiment, the first dielectric material 312, rather than the third dielectric material 314, is recessed. After filling the second trench 318 and the notches 316 with the ferromagnetic or ferrimagnetic material, in a manner similar to that illustrated in FIGS. 5N-5O, a magnetic data track such as that illustrated in FIG. 3 is produced.

Figure 7C:
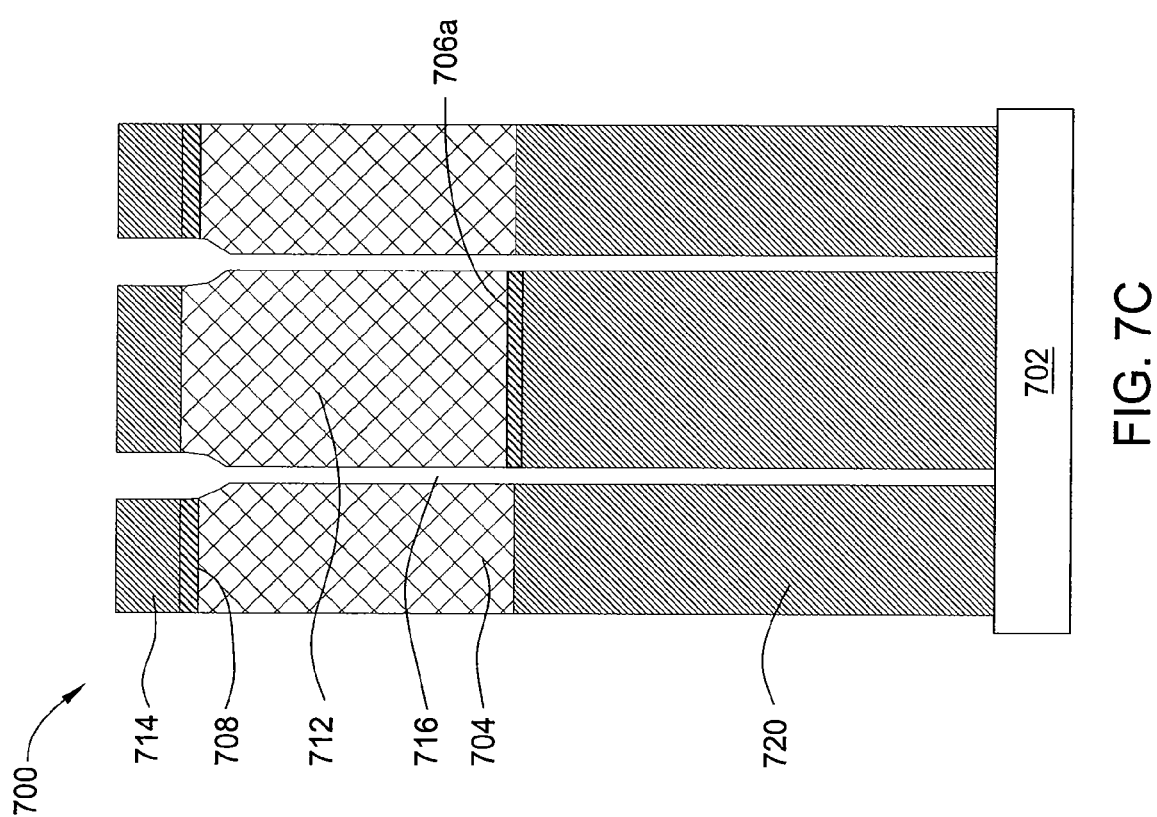

FIGS. 7A-7C illustrate a second embodiment of a method for fabricating a magnetic data tracks. Specifically, FIGS. 7A-7C illustrate cross-sectional and top views of the fabrication steps; as such, FIGS. 7A-7C also serve as a flow diagram for the method according to the present invention.

In FIG. 7A, the interconnect structure 700 is formed in a similar manner to the method described above with respect to FIGS. 5A-5H, except that the first trench is etched only partway through the first stack 704 of dielectric materials, such that the bottom 706a of the trench is in contact with the top of a layer 720. In one embodiment, the layer 720 is a dielectric material or a substrate material such as silicon. A conformal layer 708 of sacrificial material is deposited over the surfaces of the first trench 706, and the first trench 706 is filled with a second dielectric material 712. The second dielectric material 712 is planarized, and resist 714 is formed and patterned.

In FIG. 7B, the second trench 716 is formed, stopping above the dielectric layer 720 rather than above the substrate 702 (e.g., as in the alternative embodiments discussed herein with reference to the preceding Figures).

In FIG. 7C, the height of the second trench 716 is extended to the substrate 702. The data track is then formed in the same manner as previously discussed, by filling the second trench 716 with a ferromagnetic material and providing contact to the top and bottom of the second trench 716.

The interconnect structure 700 may be advantageously implemented if the data track is to be extended into a substrate material, such as a silicon wafer. In this case, the etch chemistry of the second part of the etch (i.e., the etch layer 720) would be substantially different than the etch chemistry of the original, first stack 704 of dielectric materials. In this example, the layer 720 could comprise silicon or amorphous silicon, and the first stack 704 of dielectric materials could comprise one or more of: oxide, nitride, or low-k dielectric materials with or without porosity.

The interconnect structure 700 may also be advantageous for use with very deep data tracks. If there is a limit as to the height of the first trench 706 that can be effectively filled with the second dielectric material 712, the method illustrated in FIGS. 7A-7C can be incorporated to extend the height of the data track. In accordance with this method, the dimensions of the data track are determined by the top region of the second trench 716. These same dimensions can be extended into the layer 720. During the reactive ion etch of the bottom region of the data track (within the layer 720), the top region of the data track (between the first stack 704 of dielectric materials and the second dielectric material 712) will act as the etch mask to define the dimensions of the bottom region of the data track.

While the foregoing is directed to embodiments of the present invention, other and further embodiments of the invention may be devised without departing from the basic scope thereof. Various embodiments presented herein, or portions thereof, may be combined to create further embodiments. Furthermore, terms such as top, side, bottom, front, back, and the like are relative or positional terms and are used with respect to the exemplary embodiments illustrated in the figures, and as such these terms may be interchangeable.

What is claimed is:

1. An electrical interconnect structure, comprising:
   a first stack of dielectric material comprising a first dielectric material;
   a second stack of dielectric material surrounding the first stack of dielectric material and comprising at least a second dielectric material; and
   at least one conducting element, positioned between the first stack of dielectric material and the second stack of dielectric material, the at least one conducting element having a high aspect ratio and a substantially rectangular cross section.

2. The electrical interconnect structure of claim 1, wherein the at least one conducting element has a width between approximately one nanometer and approximately one hundred nanometers.

3. The electrical interconnect structure of claim 1, wherein the at least one conducting element has a width:height ratio of greater than approximately 1:200.

4. The electrical interconnect structure of claim 1, wherein the at least one conducting element has a width:height ratio of greater than approximately 1:500.

5. The electrical interconnect structure of claim 1, wherein the at least one conducting element has a height between approximately one micron and approximately one hundred microns.

6. The electrical interconnect structure of claim 1, wherein at least one of the first stack of dielectric material and the second stack of dielectric material further comprises at least one of: a conducting line and a via interconnect structure.

7. The electrical interconnect structure of claim 1, wherein the second stack of dielectric material comprises:
   a first plurality of layers of the second dielectric material; and
   a second plurality of layers of a third dielectric material,
      wherein the first plurality of layers and the second plurality of layers are arranged in an alternating fashion.

8. The electrical interconnect structure of claim 7, wherein one or more layers in the second plurality of layers is etched to recess in the data track.

9. The electrical interconnect structure of claim 1, wherein at least one of the first dielectric material and the second dielectric material comprises at least one of: a silicon oxide, a silicon nitride, a silicon carbide, a low k dielectric material, and a porous low k dielectric material.

10. The electrical interconnect structure of claim 1, wherein a first thin layer of material having a width substantially equal to a width of the conducting element is disposed along the width of the conducting element.

11. The electrical interconnect structure of claim 10, wherein the first thin layer of material comprises at least one of: a carbon-containing material, a silicon-containing material, a plasma enhanced chemical vapor deposition deposited material, an atomic layer deposition deposited material, or a material having a composition that can be selectively removed to the first dielectric material and the second dielectric material.

12. The electrical interconnect structure of claim 10, wherein the first thin layer of material is electrically insulating.

13. The electrical interconnect structure of claim 10, wherein the first thin layer of material is electrically conducting.

14. The electrical interconnect structure of claim 13, further comprising:
   one or more electrically insulating trenches having a width substantially equal to the width of the conducting element, the one or more insulating trenches comprising second thin layers of material disposed between adjacent conducting elements.

15. The electrical interconnect structure of claim 14, wherein each of the one or more electrically insulating trenches comprises at least one of: an air gap, a low k dielectric material, a dielectric material, a dielectric material containing air gaps, or a dielectric material containing porosity.

16. A memory device, comprising:
   a first stack of dielectric material comprising a first dielectric material;
   a second stack of dielectric material surrounding the first stack of dielectric material and comprising at least a second dielectric material; and
   at least one data track for storing information, positioned between the first stack of dielectric material and the second stack of dielectric material, the at least one data track having a high aspect ratio and a substantially rectangular cross section.

17. The memory device of claim 16, wherein the at least one data track comprises:
a plurality of magnetic domains; and
a plurality of magnetic domain walls separating the plurality of magnetic domains.

18. The memory device of claim 17, wherein the at least one data track forms a magnetic shift-register memory device in which orientations of the plurality of magnetic domains are shifted by passing current through the at least one data track.

19. The memory device of claim 16, wherein then at least one data track comprises at least one of: a ferromagnetic material and a ferrimagnetic material.

20. The memory device of claim 16, wherein the at least one data track comprises a plurality of layers of different magnetic materials.

21. The memory device of claim 16, wherein at least one of the first stack of dielectric material and the second stack of dielectric material contains a magnetic tunnel junction device.

22. A method for fabricating an electrical interconnect structure, comprising:
providing a first stack of dielectric material comprising a first dielectric material;
providing a second stack of dielectric material surrounding the first stack of dielectric material and comprising at least a second dielectric material; and
providing at least one conducting element for storing information, positioned between the first stack of dielectric material and the second stack of dielectric material, the at least one conducting element having a high aspect ratio and a substantially rectangular cross section.

23. The method of claim 22, wherein the providing the at least one conducting element comprises:
forming the second stack of dielectric material on a substrate;
etching a first trench into the second stack of dielectric material;
lining the first trench with a first thin layer of material;
filling a remainder of the first trench with the first stack of dielectric material; and
etching at least a second trench into the first thin layer of material, the second trench having a high aspect ratio and a substantially rectangular cross section.

24. The method of claim 23, further comprising:
filling at least one of the at least a second trench with at least one of: a ferromagnetic material and a ferrimagnetic material.

25. The method of claim 24, further comprising:
filling at least one of the at least a second trench via electrochemical deposition.

26. The method of claim 23, wherein the second trench has a width between approximately two nanometers and approximately one hundred nanometers and a height between approximately one micron and approximately one hundred microns.

27. The method of claim 23, wherein the second trench has a width:height ratio of greater than approximately 1:200.

28. The method of claim 23, wherein the first thin layer of material has a width substantially equal to a width of the conducting element and is disposed along the width of the at least one conducting element.

29. The method of claim 23, wherein the first thin layer of material comprises at least one of: a carbon-containing material, a silicon-containing material, a plasma enhanced chemical vapor deposition deposited material, an atomic layer deposition deposited material, or a material having a composition that can be selectively removed to the first dielectric material and the second dielectric material.

30. The method of claim 23, wherein the first thin layer of material has a composition substantially different than a composition of the first stack of dielectric material and a composition of the second stack of dielectric material.

31. The method of claim 23, wherein the first thin layer of material has an etch rate of at least ten times higher than an etch rate of at least one of the first stack of dielectric material and the second stack of dielectric material in at least one set of reactive ion etch conditions.

32. The method of claim 23, further comprising:
providing one or more electrically insulating trenches having a width substantially equal to a width of the conducting element and a width of the first thin layer of material, wherein the one or more electrically insulating trenches are disposed between adjacent conducting elements.

33. The method of claim 23, wherein each of the one or more electrically insulating trenches comprises at least one of: an air gap, a low k dielectric material, a dielectric material, a dielectric material containing air gaps, or a dielectric material containing porosity.

34. The method of claim 33, wherein the one or more electrically insulating trenches are formed in a common reactive ion etch step with the at least one conducting element.

35. The method of claim 22, wherein at least one of the first dielectric material and the second dielectric material comprises at least one of: a silicon oxide, a silicon nitride, a silicon carbide, a low k dielectric material, and a porous low k dielectric material.

* * * * *